United States Patent
Gschwandtner et al.

(10) Patent No.: US 6,566,271 B1
(45) Date of Patent: May 20, 2003

(54) METHOD OF PRODUCING A SEMICONDUCTOR SURFACE COVERED WITH FLUORINE

(75) Inventors: Alexander Gschwandtner, München (DE); Gudrun Innertsberger, München (DE); Andreas Grassl, München (DE); Barbara Fröschle, Dornstadt (DE); Martin Kerber, München (DE); Alexander Mattheus, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/671,827

(22) Filed: Sep. 27, 2000

Related U.S. Application Data

(63) Continuation of application No. PCT/DE99/00819, filed on Mar. 19, 1999.

(30) Foreign Application Priority Data

Mar. 27, 1998 (DE) ......................... 198 13 757

(51) Int. Cl.$^7$ ............................ H01L 21/302
(52) U.S. Cl. ....................... 438/706; 134/1.3
(58) Field of Search ................ 438/706, 710, 438/745; 134/1.3, 2, 3, 95

(56) References Cited

U.S. PATENT DOCUMENTS

| | | | |
|---|---|---|---|
| 4,973,563 A | * 11/1990 | Prigge et al. ............... | 427/299 |
| 5,022,961 A | 6/1991 | Izumi et al. | |
| 5,023,750 A | * 6/1991 | Hirayama ................... | 257/296 |
| 5,098,866 A | * 3/1992 | Clark et al. ................. | 438/591 |
| 5,167,761 A | 12/1992 | Westendorp et al. | |
| 5,181,985 A | * 1/1993 | Lampert et al. .............. | 134/11 |
| 5,234,540 A | 8/1993 | Grant et al. | |
| 5,306,672 A | * 4/1994 | Numasawa .................... | 134/3 |
| 5,328,558 A | 7/1994 | Kawamura | |
| 5,334,552 A | 8/1994 | Homma | |
| 5,336,356 A | 8/1994 | Ban et al. | |
| 5,571,576 A | 11/1996 | Qian et al. | |
| 5,683,946 A | 11/1997 | Lu et al. | |
| 5,896,875 A | * 4/1999 | Yoneda .................... | 134/100.1 |
| 6,125,859 A | * 10/2000 | Kao et al. ..................... | 134/1.1 |

OTHER PUBLICATIONS

Yasushiro Nishioka et al.: "Dramatic Improvement of Hot–Electron–Induced Interface Degradation in MOS Structures Containing F of Cl in $SiO_2$", IEEE Electron Device Letters, vol. 9, No. 1, Jan. 1988, pp. 38–40.

H.Z. Massoud: "Technology And Reliability of Ultrathin Gate And Tunneling Dielectrics", $5^{th}$ Int. Conf. On Advanced Thermal Processing of Semiconductors—RTP'97, pp. 3–15.

I.–C. Chen et al.: "Performance and Reliability Enhancement for CVD Tungsten Polycided CMOS Transistors Due to Fluorine Incorporation in the Gate Oxide", IEEE Electron Device Letters, vol. 15, No. 9, Sep. 1994, pp. 351–353.

Peter J. Wright et al.: "The Effect of Fluorine in Silicon Dioxide Gate Dielectrics", IEEE Transactions on Electron Devices, vol. 36, No. 5, May 1989, pp. 879–889.

Frystak et al.: "Pre–Oxidation Cleaning of Silicon Using Remote Plasma", Center for Electronic Materials and Processing, University Park, PA, abstract No. 511, p. 761.

Froeschle et al.: "Characterization of Oxide Etching and Wafer Cleaning Using Vapor–Phase Anhydrous HF and Ozone", MRS 1997, vol. 470, 6 pages.

Froeschle et al.: "Cleaning Process Optimization in a Gate Oxide Cluster Tool Using an In–Line XPS Module", MRS 1997, Cleaning Session, vol. 477, 7 pages.

Froeschle et al.: "In–Line X–Ray Photoelectron Spectroscopy For Anhydrous Hydrogen Fluoride Cleaning Optimization", 9 pages.

Werkhoven et al.: "A MESC/CTMS–Based 'Best of Breed' Cluster Tool", $4^{th}$ International Conference on Advanced Thermal Processing of Semiconductors –RTP '96, pp. 146–149.

Grassl et al.: "EEPROM Gate–Stack Process on a Hot Cluster Tool", $5^{th}$ International Conference on Advanced Thermal Processing of Semiconductors –RTP '97, pp. 146–149.

Ma et al.: "Vapor Phase $SiO_2$ Etching and Metallic Contamination Removal in an Integrated Cluster System", J. Vac. Science Technology B 13(4), Jul./Aug. 1995, pp. 1460–1465.

\* cited by examiner

*Primary Examiner*—Robert Kunemund
*Assistant Examiner*—Kin-Chan Chen
(74) *Attorney, Agent, or Firm*—Laurence A. Greenberg; Werner H. Stemer; Ralph E. Locher

(57) ABSTRACT

Fluorine is deposited on a semiconductor substrate surface according to a novel process. A semiconductor substrate is placed in a reaction chamber and the substrate surface is wetted with water and/or alcohol. A compound containing fluorine is led to the substrate surface, so that a cleaned semiconductor surface covered with fluorine is produced, and the compound containing fluorine is removed from the reaction chamber. The cleaned semiconductor surface covered with fluorine is then wetted with a mixture containing at least 10% by volume of water and at least 10% by volume of alcohol, for producing a cleaned semiconductor surface covered with a predetermined amount of fluorine. The predetermined amount of fluorine is lower the higher a proportion of water in the mixture is chosen to be. Then, the water and the alcohol are removed from the semiconductor surface.

8 Claims, 1 Drawing Sheet

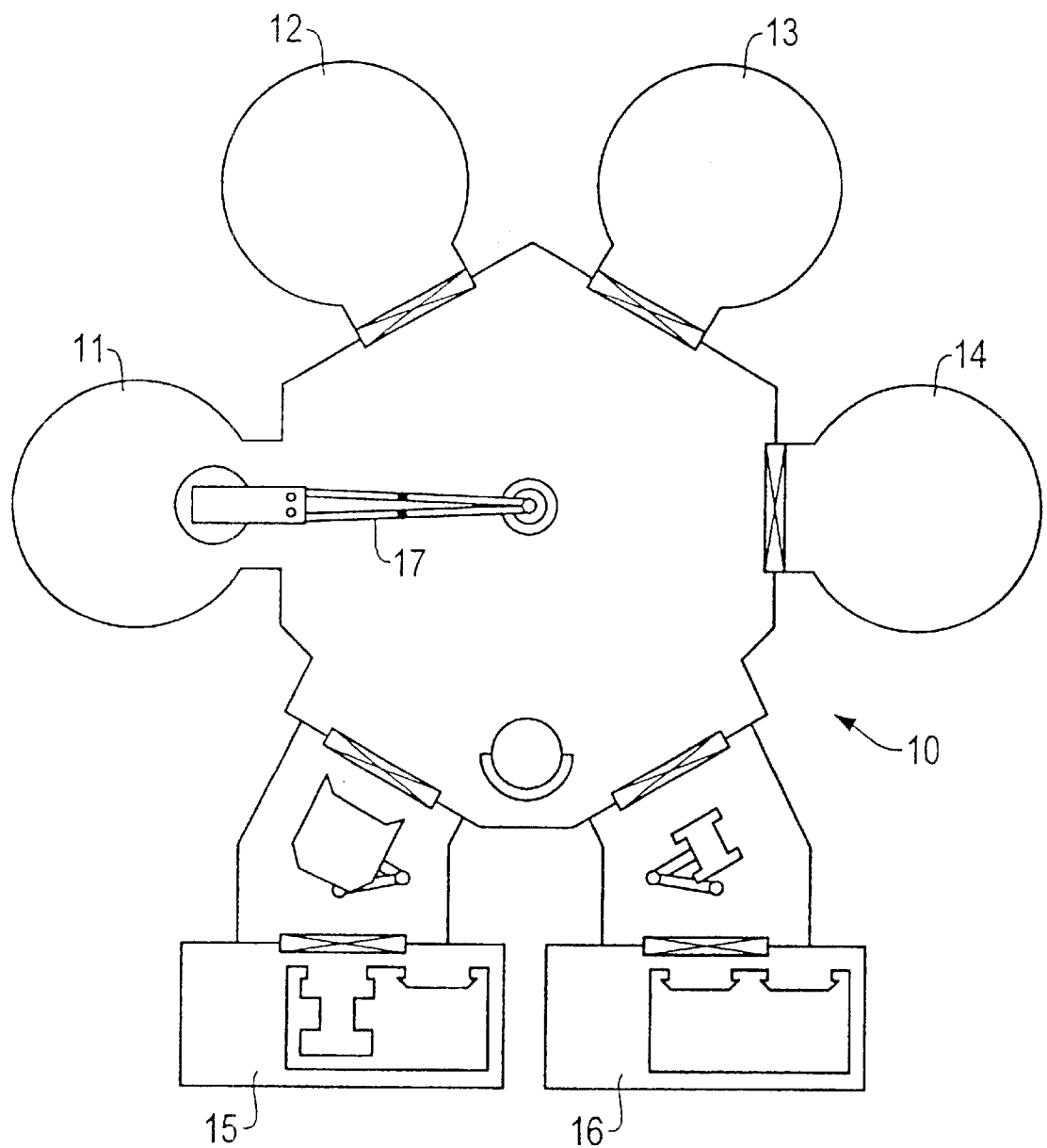

US 6,566,271 B1

METHOD OF PRODUCING A SEMICONDUCTOR SURFACE COVERED WITH FLUORINE

CROSS-REFERENCE TO RELATED APPLICATION

This is a continuation of copending International Application PCT/DE99/00819, filed Mar. 19, 1999, which designated the United States.

BACKGROUND OF THE INVENTION

FIELD OF THE INVENTION

The invention lies in the semiconductor technology field. More specifically, the present invention relates to a method of producing a semiconductor surface covered with fluorine, and in particular, to a method for producing a semiconductor surface which is covered with fluorine and on which so-called gate oxide or tunnel oxides can subsequently be produced.

In order to maintain or increase competitiveness in the international marketplace, it is necessary to continuously reduce the cost which has to be expended in order to implement a specific electronic function and thus to continuously increase the productivity. This increase in the productivity has been and is primarily achieved by increased integration of the electronic functions. The increase in the integration of the electronic functions in turn is primarily achieved by means of a progressive reduction in the size of the structure of the individual components. At the same time, it is to be considered as fortunate that the additional requirements for faster circuits and a lower power loss can likewise be met by the use of smaller and smaller structures.

Accordingly, the aim of many developments is to provide new processes which permit the production of smaller and yet smaller structures in a cost-effective way. At the same time, the production processes must satisfy several other conditions. For example, on the one hand it is necessary to optimize the parameters of the components in accordance with the desired electronic function. On the other hand, it is necessary to ensure adequate stability of these parameters over the lifetime of the component. Unfortunately, several degradation mechanisms exist which have a detrimental effect on the electrical parameters of the individual components.

The degradation mechanism which has been most investigated is the so-called HE degradation (HE=hot electron). During the operation of an MOS transistor, a field-strength peak occurs at the drain-side channel edge and can accelerate the channel electrons to a value that is close to their limiting speed. Some of these so-called hot electrons are able to overcome the potential barrier at the gate-oxide interface and jump into the gate oxide. There, among other things, these electrons can break down Si—H bonds and thus produce interface states. In an n-channel MOS transistor, the hot-electron effects primarily manifest themselves in degradation of the drain current. In a p-channel MOS transistor, the hot electron effects primarily manifest themselves in a shortening of the effective channel length.

In addition to the degradation of the transistor parameters by hot electrons, an important part is played by the degradation of the transistor parameters as a result of the application, lasting over a relatively long time period, of a gate voltage at elevated temperatures (Bias Temperature Stress, BTS), in particular for analog or mixed analog/digital circuit functions.

In analog or mixed analog/digital circuit functions, some of the MOS transistors are often operated at an operating point which reacts very sensitively to changes in the turn-on voltage of the transistor. This operating point is characterized by a gate voltage which lies only slightly above the turn-on voltage of the MOS transistor. Consequently, even small fluctuations in the turn-on voltage of the MOS transistor lead to relatively large fluctuations in the current which flows through the MOS transistor at the operating point. Since typical applications in analog circuit functions need a current which is defined as well as possible through the respective MOS transistor, fluctuations of this type in the turn-on voltage of the MOS transistor generally cannot be accepted. Unfortunately, degradation resulting from bias temperature stress (BTS) leads precisely to a change in the turn-on voltage, with the aforementioned negative effects on the analog circuit functions.

The long-term stability of the electrical parameters also plays an important role in erasable programmable read-only memories (EPROM, EEPROM). In those read-only memories, the programable elements are MOS transistors which in each case have an additional, electrically insulated polysilicon gate (floating gate). For the purpose of programming, this polysilicon gate is charged up by a tunnel current flowing through a thin oxide (tunnel dielectric). However, the tunneling charge carriers produce further interface states, which result in an increase in the conductivity of the oxide and/or a reduction in the breakdown voltage. This can in turn lead to a memory cell failing during operation.

In order to avoid these degradation mechanisms and to increase the long-term stability, several measures have been proposed. As an effective counter-measure to HE degradation, use is generally made nowadays of a so-called LDD doping (LDD=lightly doped drain) of the source/drain regions of a MOS transistor. This LDD doping requires additional process steps, however, which has a negative effect on the manufacturing costs.

In order to solve the problem of the drift in analog circuits which is caused by the bias temperature stress, hitherto measures purely involving circuitry have generally been taken. The intention of these circuit-based measures is to prevent a voltage being applied to the gate of an MOS transistor over a relatively long time period. However, the aforementioned circuit-based measures complicate the design of the circuit and in addition cost additional chip area, which therefore cannot be used for other electronic circuit functions.

In addition, it has been proposed to introduce small amounts of fluorine or chlorine into the oxide layers in order to increase their long-term stability. See, for example, Wright and Saraswat, "The Effect of Fluorine in Silicon Dioxide Gate Dielectrics", IEEE Transactions on Electron Devices, Vol. 36, No. 5, May 1989; or Chen et al., "Performance and Reliability Enhancement for CVD Tungsten Polycided CMOS Transistors due to Fluorine Incorporation in the Gate Oxide", IEEE Electron Device Letters, Vol. 15, No. 9, September 1994).

In the processes used hitherto for introducing fluorine into the oxide layers, the fluorine defuses through the oxide layer to the semiconductor interface. However, the diffusion of fluorine damages the structure of the oxide layer in such a way that the further diffusion of dopants through the oxide layer is no longer adequately prevented. The consequence of this is that the reduction achieved in this way, for example in the HE degradation, is generally not sufficient to justify the additional cost which is entailed by the introduction of fluorine or chlorine into the gate oxide. In addition, during the diffusion of the fluorine through the oxide layer, the amount of fluorine which is ultimately available at the semiconductor interface can be defined only very inaccurately. Accordingly, this method is generally not used in mass production.

U.S. Pat. No. 5,181,985 describes semiconductor cleaning processes. There, the surface of a semiconductor substrate is repeatedly fed with water vapor and gaseous hydrogen fluoride, and the semiconductor surface is subsequently rinsed with water.

U.S. Pat. No. 5,098,866 describes a process for oxide-back etching, in which, inter alia, hydrogen fluoride is supplied for the purpose of etching.

U.S. Pat. No. 5,022,961 describes a process for cleaning semiconductor surfaces in which hydrogen fluoride and alcohol are brought into contact with a substrate surface. In that process, a thin alcohol layer remains on the substrate surface. It is used to protect inadvertent oxidation and it can be removed if required.

SUMMARY OF THE INVENTION

The object of the invention is to provide a method of producing a semiconductor surface with fluorine which overcomes the above-noted deficiencies and disadvantages of the prior art devices and methods of this kind, and which provides for a fluorine-laden surface on which oxide layers of high quality can subsequently be produced, so that the problem of the degradation of oxide layers by a technological route can be solved or significantly reduced.

To the extent that, by means of this process, a layer of fluorine is applied to the substrate surface, it is desirable to be able to adjust the fluorine concentration, on the one hand in order to avoid too little fluorine being incorporated, in order to saturate unsaturated bonds, and on the other hand in order to avoid too much fluorine being incorporated, as a result of which oxide structures could be damaged.

With the above and other objects in view there is provided, in accordance with the invention, a method of producing a surface covered with fluorine, which comprises the following method steps:

placing a semiconductor substrate into a reaction chamber;

wetting a surface of the substrate with water and/or alcohol;

conducting a compound containing fluorine to the substrate surface for forming a cleaned semiconductor surface with fluorine deposited thereon;

removing the compound containing fluorine from the reaction chamber;

wetting the cleaned semiconductor surface covered with fluorine with a mixture containing at least 10% by volume of water and at least 10% by volume of alcohol, for producing a cleaned semiconductor surface covered with a predetermined amount of fluorine, whereby the predetermined amount of fluorine is lower the higher a proportion of water in the mixture is chosen to be; and removing the water and the alcohol from the semiconductor surface.

By means of the process according to the invention, firstly a semiconductor surface cleaned of oxide residues is obtained. Oxide residues of this type can be caused, for example, by the natural oxidation of the semiconductor surface or by oxide residues from preceding process steps.

As a result of the cleaning action of the process according to the invention, a semiconductor surface is obtained on which further layers of high quality can then be applied.

As a result of the process according to the invention, secondly an amount of fluorine which can be freely selected over a wide range can be applied to the semiconductor surface. During a subsequent production of the oxide layer, preferably by means of thermally activated oxidation, use is made of the effect that the fluorine is incorporated into the oxide and also at the semiconductor interface. Therefore, at the end of the process according to the invention, the fluorine is in the optimum concentration for the respective application exactly at the location at which it is needed for the stabilizing effect, without exhibiting the previously known, negative side effects. The possibility of being able to select the fluorine concentration freely as a function of the class of component to be produced means that it is possible to avoid both too little fluorine being incorporated to saturate the unsaturated bonds or too much fluorine being incorporated, so that the structure of the oxide is damaged.

However, the present process according to the invention is not restricted to the production of oxide layers. For example, a semiconductor epitaxial layer can also be applied to the surface covered with fluorine. The surface which has been cleaned and treated with fluorine in this case ensures homogeneous growth of the epitaxial layer.

In accordance with an added feature of the invention, the alcohol used is methanol or ethanol. In addition, it is preferable to use HF gas as the compound containing fluorine.

In accordance with an additional feature of the invention, the wetting step comprises feeding water vapor and alcohol vapor to the substrate surface, i.e., the water and/or the alcohol are supplied in the vapor phase.

In accordance with another feature of the invention, following the wetting step, the pressure in the reaction chamber is lowered, so that only a thin wetting layer remains on the substrate surface. An advantageous wetting layer is one to two monolayers remaining on the substrate surface. In this way, well-defined conditions for the subsequent cleaning reaction can be set.

In accordance with a further feature of the invention, the compound containing fluorine is removed from the reaction chamber by reducing the pressure. It is thereby preferable for the water and/or alcohol and the reaction products produced during the cleaning of the substrate surface to be removed from the substrate surface as well.

If high or very high fluorine concentrations are needed on the cleaned semiconductor surface, it is preferable for HF gas and ozone and/or oxygen to be fed subsequently to the cleaned semiconductor surface covered with fluorine.

Other features which are considered as characteristic for the invention are set forth in the appended claims.

Although the invention is illustrated and described herein as embodied in a method of producing a semiconductor surface covered with fluorine, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The sole FIGURE is a schematic illustration of a so-called cluster tool for carrying out the process according to the invention.

DESCRIPTION OF THE PREFERRED EMBODIMENT

Referring now to the FIGURE of the drawing in detail, the cluster tool 10 shown therein comprises four process chambers 11 to 14, in which different processing steps can be performed on a silicon wafer. In order to introduce and remove the silicon wafers, the cluster tool 10 also has so-called load locks 15 and 16. Inside the cluster tool, the silicon wafers are transported under defined conditions to the individual process chambers 11 to 14 by a robot arm 17.

In the present case, the process chamber 11 is provided for carrying out the process according to the invention. To this end, the process chamber 11 is maintained at a temperature of approximately 40° C. This can be done, for example, by means of an integrated, temperature-controlled water circuit. Any quartz windows which may be present in the process chamber 11 can be kept at the temperature by means of a suitable air stream.

A silicon wafer is introduced into the process chamber 11 by the robot arm 17 and deposited in the process chamber 11. There, the silicon wafer is likewise heated to about 40° C. by an IR lamp.

In the present example, the process according to the invention is to be used to prepare the gate oxide. It is therefore usually the case that the isolations, for example LOCOS isolations or STI isolations (STI=shallow trench isolation) are already present on or in the silicon substrate. From these preceding process steps then there are generally still oxide residues on the silicon surface, which would hamper the subsequent production of a thin gate oxide.

In order to clean and treat the silicon surface, therefore, the silicon surface is exposed to 2 slm of a mixture of methanol vapor and water vapor in nitrogen at a pressure of 500 mbar for 60 seconds. In this case, the methanol vapor and water vapor are led into the process chamber 11 through two so-called nitrogen bubblers, which are in each case kept at about 30° C. Accordingly, a thin liquid film is formed on the wafer surface and wets it.

The pressure in the chamber is then reduced to approximately 100 mbar and then 100 sccm HF gas are led into the process chamber 11 through a gas line that is heated to 40° C. In this case, the pressure is kept constant at 100 mbar. After 30 to 60 seconds, any oxide residues or natural oxide possibly present have been virtually completely removed by the etching. The following reaction occurs:

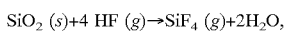

$SiO_2$ (s)+4 HF (g)→$SiF_4$ (g)+$2H_2O$, which is catalyzed by the presence of the $OH^-$-groups of the alcohol and of the water.

Following the etching, the pressure in the process chamber is reduced to a value less than 0.5 mbar, so that the HF gas can be removed from the process chamber. Then, 2 slm of a mixture of water vapor and alcohol vapor in nitrogen at a pressure of 500 mbar is led to the cleaned silicon surface for 60 seconds. In this case, it is true that the higher the proportion of water (maximum 90%) is chosen to be, the lower is the remaining fluorine concentration at the silicon surface. A virtually completely cleaned silicon surface is therefore obtained, whose uppermost layer is covered with less than 1% to 30% fluorine.

The pressure in the process chamber 11 is then once more reduced to a value less than 0.5 mbar, so that the water and the alcohol are removed from the silicon surface by evaporation.

At the end of the process according to the invention, the fluorine is therefore at the optimum concentration for the respective application exactly at the location at which it is needed for the stabilizing effect. The possibility of being able to select the fluorine concentration freely as a function of the class of component to be produced means that it is possible to avoid too little fluorine being incorporated to saturate the unsaturated bonds at the silicon/silicon oxide interface or too much fluorine being incorporated, so that the structure of the oxide to be subsequently produced is damaged.

Should particularly high concentrations of fluorine at the silicon surface be needed for an application, this can be set by a subsequent treatment step using a compound containing fluorine.

To this end, it is preferable for a mixture of ozone and oxygen (proportion of the ozone in this mixture between 0.5% and 15%) and HF gas at a temperature of about 40° C. to 700° C. and a pressure of about 1000 mbar to be led into the process chamber 11. This produces a very thin oxide layer with a high fluorine concentration.

As an alternative, oxygen and HF gas at an elevated temperature of more than 700° C. can also be led into the process chamber 11. This likewise produces a very thin oxide layer with a high fluorine concentration.

Once the cleaning and treatment of the silicon surface has been concluded, the silicon wafer is removed from the process chamber by the robot arm 17 and, for example, moved to the process chamber 12, where a thin gate oxide layer is produced by thermal oxidation or by CVD deposition.

We claim:

1. A method of producing a surface covered with fluorine, which comprises the following method steps:

placing a semiconductor substrate into a reaction chamber;

wetting a surface of the substrate with a material selected from the group consisting of water, alcohol, and a mixture of water and alcohol;

lowering a pressure in the reaction chamber, causing a wetting layer to remain on the substrate surface;

conducting a compound containing fluorine to the substrate surface for forming a cleaned semiconductor surface with fluorine deposited thereon;

removing the compound containing fluorine from the reaction chamber;

wetting the cleaned semiconductor surface covered with fluorine with a mixture containing at least 10% by volume of water and at least 10% by volume of alcohol, for producing a cleaned semiconductor surface covered with an amount of fluorine, whereby the higher a proportion of water in the mixture is chosen to be, the lower the amount of fluorine becomes; and removing the water and the alcohol from the semiconductor surface.

2. The method according to claim 1, which comprises selecting the alcohol from the group consisting of methanol and ethanol.

3. The method according to claim 1, wherein the compound containing fluorine is HF gas.

4. The method according to claim 1, wherein the wetting step comprises feeding water vapor and alcohol vapor to the substrate surface.

5. The method according to claim 1, wherein the removing step comprises reducing a pressure in the reaction chamber.

6. The method according to claim 1, wherein the removing step comprises reducing a pressure in the reaction chamber for removing the compound containing fluorine, removing the material used in the wetting step and reaction products produced during the cleaning of the substrate surface from the substrate surface.

7. The method according to claim 1, which comprises subsequently feeding HF gas together with one of ozone and oxygen to the cleaned semiconductor surface covered with fluorine.

8. The method according to claim 1, wherein the wetting layer remaining on the substrate surface has a thickness at most equal to two monolayers.

* * * * *